(12) United States Patent
Chen

(10) Patent No.: US 12,143,084 B1
(45) Date of Patent: Nov. 12, 2024

(54) IMPEDANCE ADJUSTING CIRCUIT AND IMPEDANCE ADJUSTING METHOD FOR ZERO QUOTIENT CALIBRATION

(71) Applicant: NANYA TECHNOLOGY CORPORATION, New Taipei (TW)

(72) Inventor: Yu-Wei Chen, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 28 days.

(21) Appl. No.: 18/302,767

(22) Filed: Apr. 18, 2023

(51) Int. Cl.
  *H03H 11/28* (2006.01)
(52) U.S. Cl.
  CPC .................................. *H03H 11/28* (2013.01)
(58) Field of Classification Search
  CPC ....................................................... H03H 11/28
  USPC ........................................................... 327/551
  See application file for complete search history.

(56) References Cited

U.S. PATENT DOCUMENTS

2016/0211031 A1\* 7/2016 Taigor ..................... G11C 5/147
2020/0265878 A1 8/2020 Ahn

FOREIGN PATENT DOCUMENTS

| CN | 112187214 | 1/2021 |
| TW | 1336559 | 1/2011 |
| TW | 201228221 | 7/2012 |

OTHER PUBLICATIONS

"Office Action of Taiwan Counterpart Application", issued on Jun. 14, 2024, p. 1-p. 5.

\* cited by examiner

*Primary Examiner* — Tomi Skibinski
(74) *Attorney, Agent, or Firm* — JCIPRNET

(57) ABSTRACT

An impedance adjusting circuit and an impedance adjusting method for zero quotient (ZQ) calibration. The impedance adjusting circuit includes a reference resistor, a pull-up impedance generator, a controller and a detection circuit. The reference resistor is coupled between a sensing node and a low reference voltage. The pull-up impedance generator is coupled to an external voltage. The controller connects the pull-up impedance generator to the sensing node and compares a reference voltage and a sensing voltage on the sensing node to generate the calibration signal in a ZQ calibrating operation. When the sensing voltage is out of a specification range in the ZQ calibrating operation, the detection circuit notifies the controller to perform a compensation operation on the pull-up impedance generator, and modify the calibration signal to an adjusted calibration signal.

18 Claims, 5 Drawing Sheets

IMPEDANCE ADJUSTING CIRCUIT AND IMPEDANCE ADJUSTING METHOD FOR ZERO QUOTIENT CALIBRATION

BACKGROUND

Technical Field

The disclosure generally relates to an impedance adjusting circuit and an impedance adjusting method, and more particularly to an impedance adjusting circuit and an impedance adjusting method for zero quotient (ZQ) calibration.

Description of Related Art

Generally, a memory device operates according to an impedance of a drive capability resistor (RON) or a termination resistor (RTT) of an on-die-termination (ODT) element. For example, an input/output terminal (I/O) voltage (VDDQ) of the memory device may be adjusted by the impedance of the RON or the RTT. However, when the ZQ calibration has a low resolution, a ZQ calibration result of the ZQ calibration may not meet an expected specification. Thus, how to make the ZQ calibration result of the ZQ calibration meet the expected specification is one of the research priorities for the skilled in the art.

SUMMARY

The disclosure provides an impedance adjusting circuit and an impedance adjusting method for zero quotient (ZQ) calibration.

The impedance adjusting circuit includes a reference resistor, a first pull-up impedance generator, a controller and a detection circuit. The reference resistor is coupled between a first sensing node and a low reference voltage. The first pull-up impedance generator is coupled to an external voltage. The first pull-up impedance generator includes a plurality of first pull-up impedance units for providing a first resistance value respectively in response to a first calibration signal. The controller is coupled to the first sensing node. The controller connects the first pull-up impedance generator to the first sensing node, and compares a first reference voltage and a sensing voltage on the first sensing node to generate the first calibration signal in a first ZQ calibrating operation. The detection circuit is coupled to the first sensing node and the controller. The detection circuit detects the sensing voltage. When the sensing voltage is out of a first specification range in the first ZQ calibrating operation, the detection circuit notifies the controller to perform a first compensation operation on the first pull-up impedance generator, and modify the first calibration signal to an adjusted first calibration signal.

The impedance adjusting method includes: providing a reference resistor and a first pull-up impedance generator, wherein the reference resistor is coupled between a first sensing node and a low reference voltage, wherein the first pull-up impedance generator comprises a plurality of first pull-up impedance units for providing a first resistance value respectively in response to a first calibration signal; connecting the first pull-up impedance generator to the first sensing node; comparing a first reference voltage and a sensing voltage on the first sensing node to generate the first calibration signal in a first ZQ calibrating operation; detecting the sensing voltage; and when the sensing voltage is out of a first specification range in the first ZQ calibrating operation, performing a first compensation operation on the first pull-up impedance generator, so as to modify the first calibration signal to an adjusted first calibration signal.

Based on the above, when the sensing voltage is out of a first specification range in the first ZQ calibrating operation, the first compensation operation is performed on the first pull-up impedance generator, the first calibration signal is modified to the adjusted first calibration signal. Therefore, the ZQ calibration result of the ZQ calibration meets an expected specification.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Figure 1:
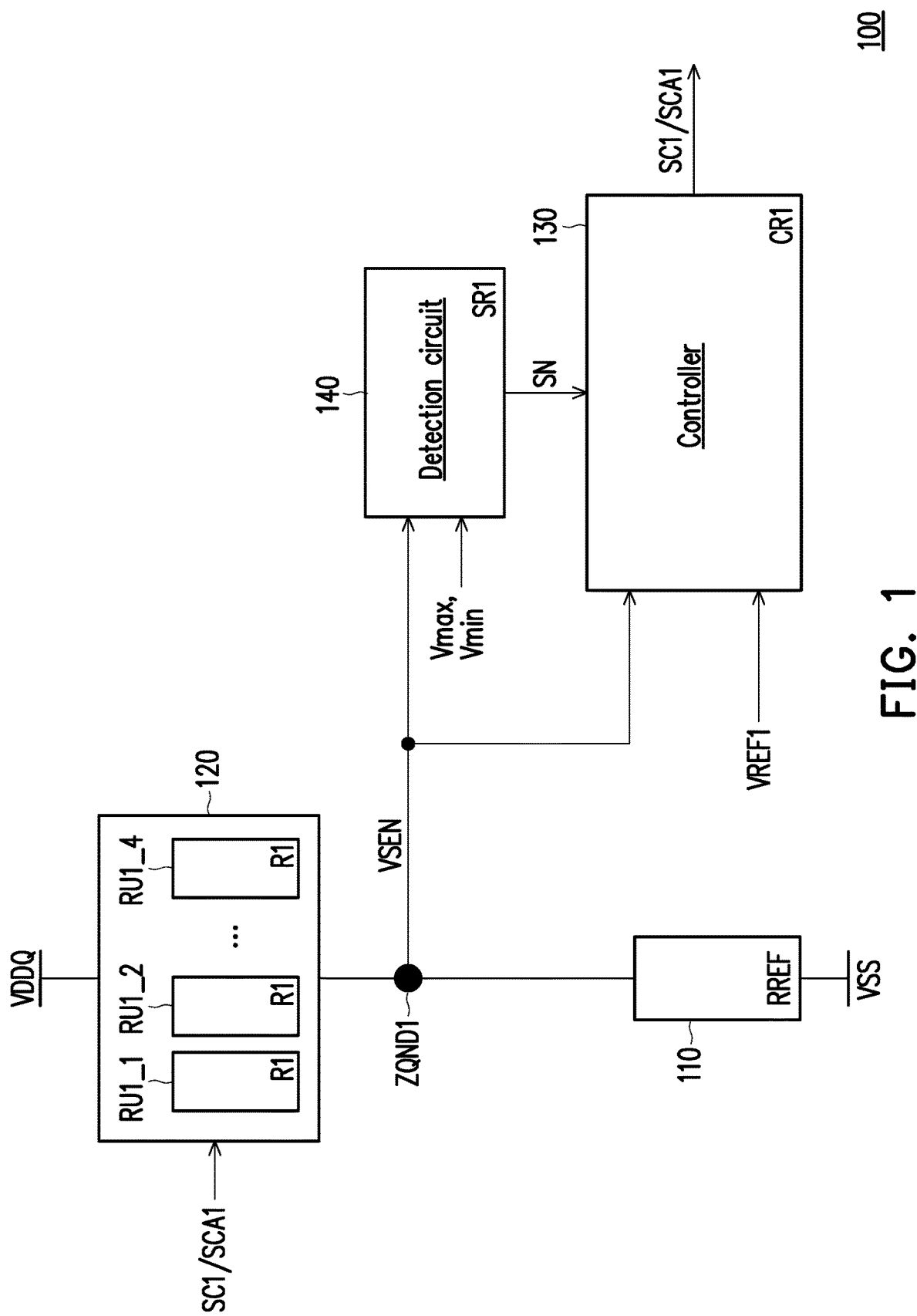
FIG. 1 illustrates a schematic diagram of an impedance adjusting circuit according to an embodiment of the disclosure.

FIG. 1 illustrates a schematic diagram of an impedance adjusting circuit according to an embodiment of the disclosure. Please refer to FIG. 1, the impedance adjusting circuit 100 for zero quotient (ZQ) calibration includes a reference resistor 110, a first pull-up impedance generator 120, a controller 130 and a detection circuit 140. The reference resistor 110 is coupled between a first sensing node ZQND1 and a low reference voltage VSS. For example, the low reference voltage VSS is ground or a reference voltage having 0 volt, but the disclosure is not limited thereto. In the embodiment, the reference resistor 110 is a precision resistor. The reference resistor 110 has a reference resistance value RREF. The reference resistance value RREF is not variated with variation of voltage and temperature conditions. In other words, the reference resistance value RREF is stable. In the embodiment, the first sensing node ZQND1 may be a connecting pad, but the disclosure is not limited thereto.

In the embodiment, the first pull-up impedance generator 120 is coupled to an external voltage VDDQ. The first pull-up impedance generator 120 includes first pull-up impedance units RU1_1 to RU1_4. The first pull-up impedance units RU1_1 to RU1_4 provide a first resistance value R1 respectively in response to a first calibration signal SC1.

In the embodiment, in a first ZQ calibrating operation, the controller 130 connects the first pull-up impedance generator 120 to the first sensing node ZQND1. In a first ZQ calibrating operation, the controller 130 compares a first reference voltage VREF1 and a sensing voltage VSEN on the first sensing node ZQND1 to generate the first calibration signal SC1. The detection circuit 140 is coupled to the first sensing node ZQND1 and the controller 130. The detection circuit 140 detects the sensing voltage VSEN.

When the sensing voltage VSEN is out of a first specification range SR1 in the first ZQ calibrating operation, the detection circuit 140 notifies the controller 130 to perform a first compensation operation on the first pull-up impedance generator 120. In the first compensation operation, the controller 130 modifies the first calibration signal SC1 to an adjusted first calibration signal SCA1. Therefore, the ZQ calibration result of the first ZQ calibrating operation meets an expected specification. In the embodiment, the first specification range SR1 is a voltage range corresponds a tolerance of the first resistance value R1 (for example, 10%). The first specification range SR1 is positively related to the tolerance of the first resistance value R1.

For example, the detection circuit 140 receives reference specification voltages Vmax and Vmin. The detection circuit 140 generates the first specification range SR1 according to the reference specification voltages Vmax and Vmin. The reference specification voltages Vmax corresponds to an upper limit of the first specification range SR1. The reference specification voltages Vmin corresponds to a lower limit of the first specification range SR1. In other words, when the sensing voltage VSEN is lower than the reference specification voltages Vmin or higher than the reference specification voltages Vmax, the detection circuit 140 generate a notification signal SN to the controller 130. The controller 130 performs the first compensation operation on the first pull-up impedance generator 120 in response to the notification signal SN.

On the other hand, when the sensing voltage VSEN is in the first specification range SR1 in the first ZQ calibrating operation, the sensing voltage VSEN is between the reference specification voltages Vmin and Vmax. Therefore, the detection circuit 140 notifies the controller 130 to stop performing the first compensation operation. In other words, when the sensing voltage VSEN is in the first specification range SR1 in the first ZQ calibrating operation, the first calibration signal SC1 is equal to the adjusted first calibration signal SCA1.

For example, the reference resistance value RREF is 240 Ohm. The first resistance value R1 is about 240 Ohm. The first pull-up impedance units RU1_1 to RU1_4 are calibrated one by one in the first ZQ calibrating operation. Thus, the first reference voltage VREF1 is set to half of the external voltage VDDQ (that is, VREF1=0.5×VDDQ). For example, all of the first pull-up impedance units RU1_1 to RU1_4 are connected in parallel in the first ZQ calibrating operation. Thus, the first reference voltage VREF1 is set to 0.8×VDDQ in the first ZQ calibrating operation.

For example, the controller 130 generates the first calibration signal SC1 by a bisection method in the first ZQ calibrating operation. The first calibration signal SC1 is a trim digital code having a plurality of bits. Thus, the controller 130 generates the first calibration signal SC1 in a (n)th cycles of the bisection method. The "n" is positive integer greater than "1". For example, the first calibration signal SC1 is a 4-bit trim digital code. Thus, the controller 130 performs the first ZQ calibrating operation having 4 cycles, but the disclosure is not limited thereto. The controller 130 generates the first calibration signal SC1 in after a fourth cycle (that is, a final cycle) of the bisection method. Based on the bisection method, the controller 130 performs the first ZQ calibrating operation rapidly.

The detection circuit 140 detects the sensing voltage VSEN after a final cycle of the first ZQ calibrating operation. When the sensing voltage VSEN is in the first specification range SR1 in the first ZQ calibrating operation, it means that the tolerance of the first resistance value R1 is lower than a default tolerance value. The first calibration signal SC1 does not need to be adjusted. Therefore, the detection circuit 140 notifies the controller 130 that it is not necessary to perform the first compensation operation.

When the sensing voltage VSEN is out of the first specification range SR1 in the first ZQ calibrating operation, it means that the tolerance of the first resistance value R1 is higher than the default tolerance value. The controller 130 cannot adjust the tolerance of the first resistance value R1 to be in the default tolerance value by performing the first ZQ calibrating operation. Therefore, the detection circuit 140 notifies the controller 130 to perform the first compensation operation on the first pull-up impedance generator 120. In the first compensation operation, the controller 130 modifies the first calibration signal SC1 to an adjusted first calibration signal SCA1.

For example, an adjusting resolution of the first compensation operation is higher than an adjusting resolution of the first ZQ calibrating operation. When the sensing voltage VSEN is out of the first specification range SR1 in the first ZQ calibrating operation, it means that the adjusting resolution of the first ZQ calibrating operation is not enough. Thus, in the first compensation operation, the controller 130 trims the first calibration signal with the adjusting resolution of the first compensation operation. The first compensation operation may be another bisection method or a successive-approximation method having a higher resolution, but the disclosure is not limited thereto.

In the embodiment, the first pull-up impedance generator 120 includes four first pull-up impedance units RU1_1 to RU1_4. In some embodiments, the first pull-up impedance generator 120 includes at least one first pull-up impedance unit, the disclosure is not limited by the amount of the first pull-up impedance unit.

For the above example, the controller 130 performs the first ZQ calibrating operation having 4 cycles. In the first compensation operation, when the sensing voltage corresponding a calibration signal in a third cycle (that is, a (n−1)th cycle) of the bisection method is in the first specification range SR1, the controller 130 sets the calibration signal in the third cycle of the first ZQ calibrating operation as the adjusted first calibration signal.

Figure 2:
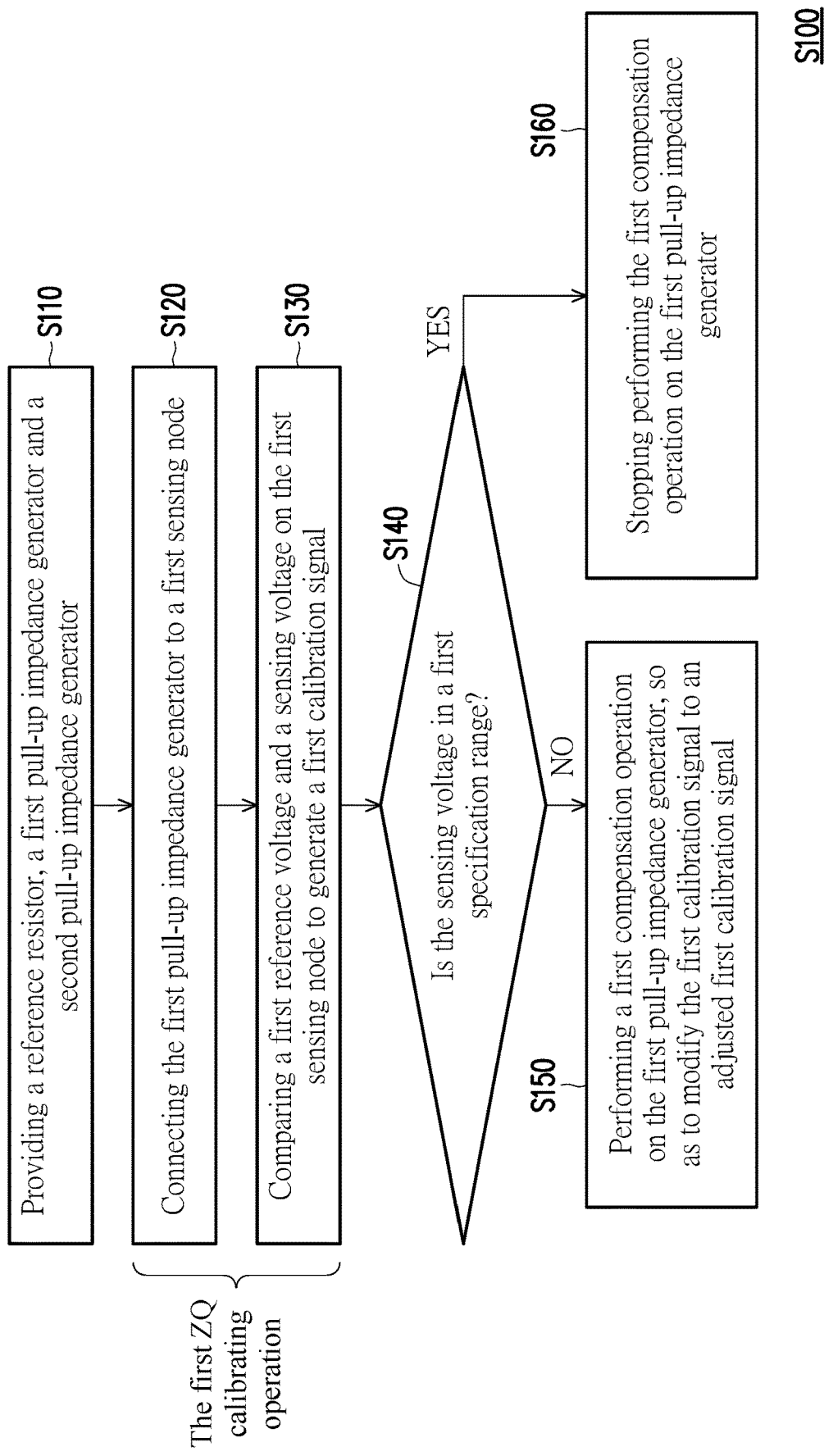
FIG. 2 illustrates a flow chart of an impedance adjusting method according to an embodiment of the disclosure.

FIG. 2 illustrates a flow chart of an impedance adjusting method according to an embodiment of the disclosure. Please refer to FIG. 1 and FIG. 2, in the embodiment, the impedance adjusting method S100 includes steps S110 to S150. In the step S110, the reference resistor 110 and the first pull-up impedance generator 120 are provided. The configuration of the reference resistor 110 and the first pull-up impedance generator 120 has been clearly explained in the embodiment of FIG. 1, so it will not be repeated here.

In the step S120, in the first ZQ calibrating operation, the first pull-up impedance generator 120 is connected to the first sensing node ZQND1. In the embodiment, the first pull-up impedance generator 120 is connected to the first sensing node ZQND1 in the first ZQ calibrating operation. In the step S120, in the first ZQ calibrating operation, the sensing voltage VSEN in generated according to the external voltage VDDQ, the first resistance value R1 and the reference resistance value RREF. In other words, the sensing voltage VSEN is a divided result of the external voltage VDDQ based on the first resistance value R1 and the reference resistance value RREF in the first ZQ calibrating operation.

In the step S130, in the first ZQ calibrating operation, the controller 130 compares the first reference voltage VREF1 and the sensing voltage VSEN to generate the first calibration signal SC1. Therefore, the first pull-up impedance generator 120 adjusts the first resistance value R1 in response to the first calibration signal SC1.

In the step S130, the controller 130 compares a first reference voltage VREF1 and the sensing voltage VSEN to generate a first comparation result CR1 in the first ZQ calibrating operation. In the first ZQ calibrating operation, when the first comparation result CR1 indicates that the sensing voltage VSEN is higher than the first reference voltage VREF1, the controller 130 adjusts a value of the first calibration signal SC1 to a first value. Therefore, the first resistance value R1 is increased by the first value of the first calibration signal SC1. When the first comparation result CR1 indicates that the sensing voltage VSEN is lower than the first reference voltage VREF1, the controller 130 adjusts a value of the first calibration signal SC1 to a second value. Therefore, the first resistance value R1 is decreased by the second value of the first calibration signal SC1. Besides, when the first comparation result CR1 indicates that the sensing voltage VSEN is equal to the first reference voltage VREF1, the first resistance value R1 is equal to the reference resistance value RREF. Thus, the first calibration signal SC1 is not adjusted.

For example, the first calibration signal SC1 is the 4-bit trim digital code, but the disclosure is not limited thereto. The controller 130 may adjust the digital values of the first calibration signal SC1 by 4 cycles. The first resistance values R1 of the first pull-up impedance units RU1_1 to RU1_4 are positively related to the digital values of the first calibration signal SC1. For example, the first resistance values R1 of the first pull-up impedance units RU1_1 to RU1_4 are proportional to the digital values of the first calibration signal SC1.

Taking the first pull-up impedance unit RU1_1 as an example, in the first ZQ calibrating operation, when the first resistance value R1 of the first pull-up impedance unit RU1_1 is calibrated, the first pull-up impedance unit RU1_1 is enabled. The first pull-up impedance units RU1_2 to RU1_4 are disabled. When the first resistance value R1 of the first pull-up impedance unit RU1_1 is calibrated, the controller 130 provides the first calibration signal SC1 having a binary-type of an initial digital value "1000" to the first pull-up impedance unit RU1_1 in a first cycle of the first ZQ calibrating operation. If the first comparation result CR1 indicates that the sensing voltage VSEN is higher than the first reference voltage VREF1, the controller 130 provides the first calibration signal SC1 having a digital value "1100" to the first pull-up impedance unit RU1_1 in a second cycle of the first ZQ calibrating operation. Then, if the first comparation result CR1 indicates that the sensing voltage VSEN is lower than the first reference voltage VREF1, the controller 130 provides the first calibration signal SC1 having a digital value "1010" to the first pull-up impedance unit RU1_1 a third cycle of the first ZQ calibrating operation. Then, if the first comparation result CR1 indicates that the sensing voltage VSEN is higher than the first reference voltage VREF1, the controller 130 provides the first calibration signal SC1 having a digital value "1011" to the first pull-up impedance unit RU1_1 a fourth cycle of the first ZQ calibrating operation.

In the step S140, the detection circuit 140 determines the sensing voltage VSEN after the fourth cycle (that is, the final cycle) of the first ZQ calibrating operation. When the sensing voltage VSEN is out of the first specification range SR1. The controller 130 performs the first compensation operation on the first pull-up impedance generator 120 in the step S150, so as to modify the first calibration signal SC1 to an adjusted first calibration signal SCA1.

For example, in the step S150, when the sensing voltage VSEN corresponding a calibration signal (that is, "1010") in the third cycle is in the first specification range SR1, the controller 130 sets the calibration signal in the third cycle of the first ZQ calibrating operation as the adjusted first calibration signal SCA1.

For example, in the step S150, the controller 130 trims the first calibration signal with the adjusting resolution of the first compensation operation. The adjusting resolution of the first compensation operation is higher than the adjusting resolution of the first ZQ calibrating operation.

When the sensing voltage VSEN is in the first specification range SR1. The controller 130 stops performing the first compensation operation on the first pull-up impedance generator in the step S160.

Figure 3:
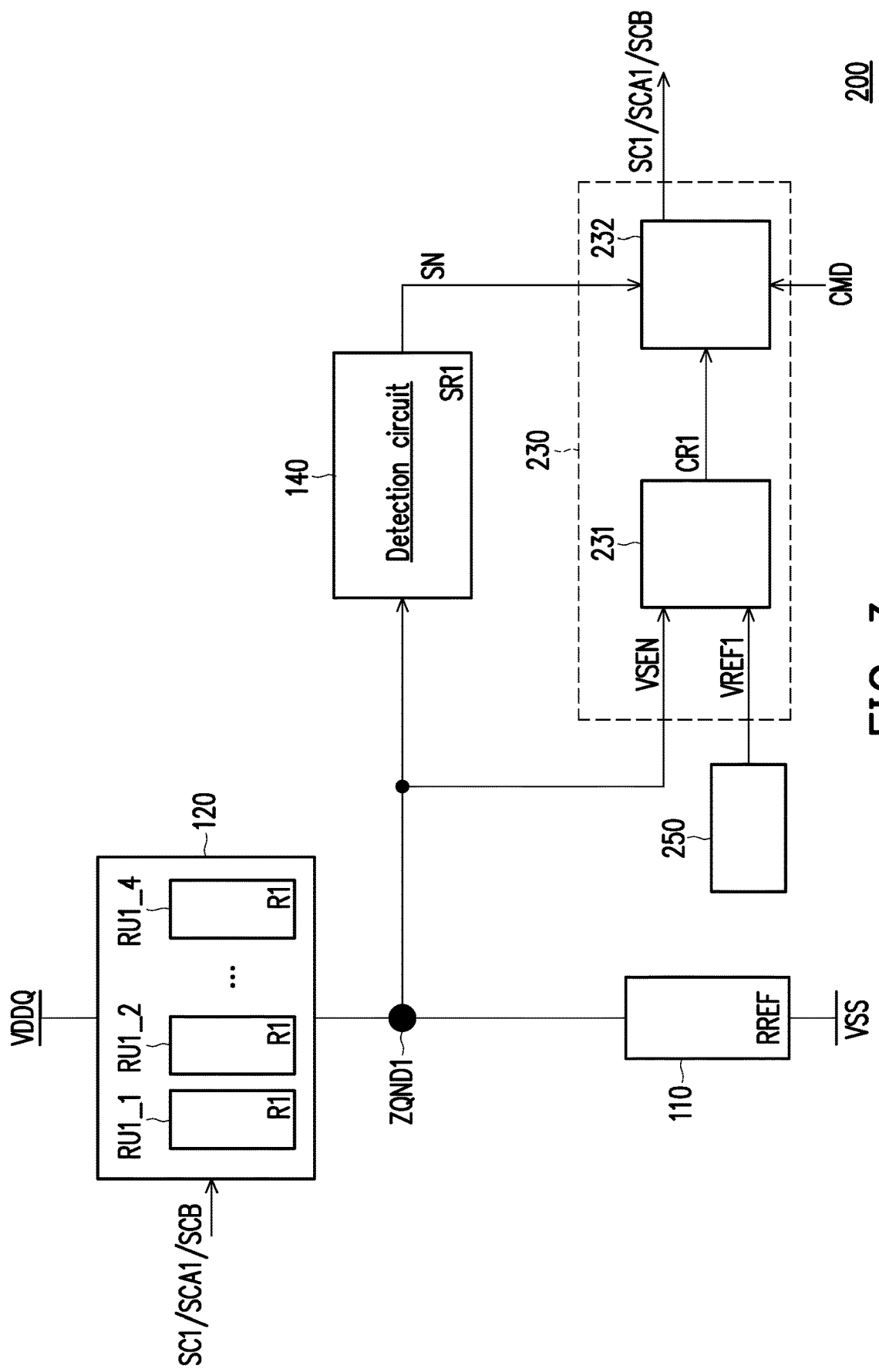
FIG. 3 illustrates a schematic diagram of an impedance adjusting circuit according to an embodiment of the disclosure.

FIG. 3 illustrates a schematic diagram of an impedance adjusting circuit according to an embodiment of the disclosure. Please refer to FIG. 3, in the embodiment, the impedance adjusting circuit 200 includes the reference resistor 110, the first pull-up impedance generator 120, a controller 230, the detection circuit 140 and a reference voltage generator 250. The configuration of the reference resistor 110, the first pull-up impedance generator 120 and the detection circuit 140 has been clearly explained in the embodiments of FIG. 1 and FIG. 2, so it will not be repeated here.

In the embodiment, the reference voltage generator 250 is coupled to the controller 230. The reference voltage generator 250 provides the first reference voltage VREF1. The controller 230 includes a comparator 231 and a signal adjusting circuit 232. The comparator 231 is coupled to the reference voltage generator 250 and the first sensing node ZQND1.

The comparator 231 compares the first reference voltage VREF1 and the sensing voltage VSEN to generate the first comparation result CR1 in the first ZQ calibrating operation.

The signal adjusting circuit 232 is coupled to the comparator 231, the first pull-up impedance generator 120 and the detection circuit 140. The signal adjusting circuit 232 adjusts the first calibration signal SC1 according to the first comparation result CR1 in the first ZQ calibrating operation. The signal adjusting circuit 232 modifies the first calibration signal SC1 to the adjusted first calibration signal SCA1 in response to the notification signal SN.

The first ZQ calibrating operation and the first compensation operation have been clearly explained in the embodiment of FIG. 1, so it will not be repeated here.

In the embodiment, the first calibration signal SC1 is set as a built-in calibration signal SCB. The built-in calibration signal SCB may be a fused code saved in the controller 230. When the reference resistor 110 is removed, the controller 230 may output the built-in calibration signal SCB to the first pull-up impedance generator 120 in response to an external command CMD. Therefore, the first pull-up impedance generator 120 adjusts the first resistance value R1 in response to the built-in calibration signal SCB. In the embodiment, the signal adjusting circuit 232 outputs the built-in calibration signal SCB to the first pull-up impedance generator 120 in response to the external command CMD.

Figure 4:
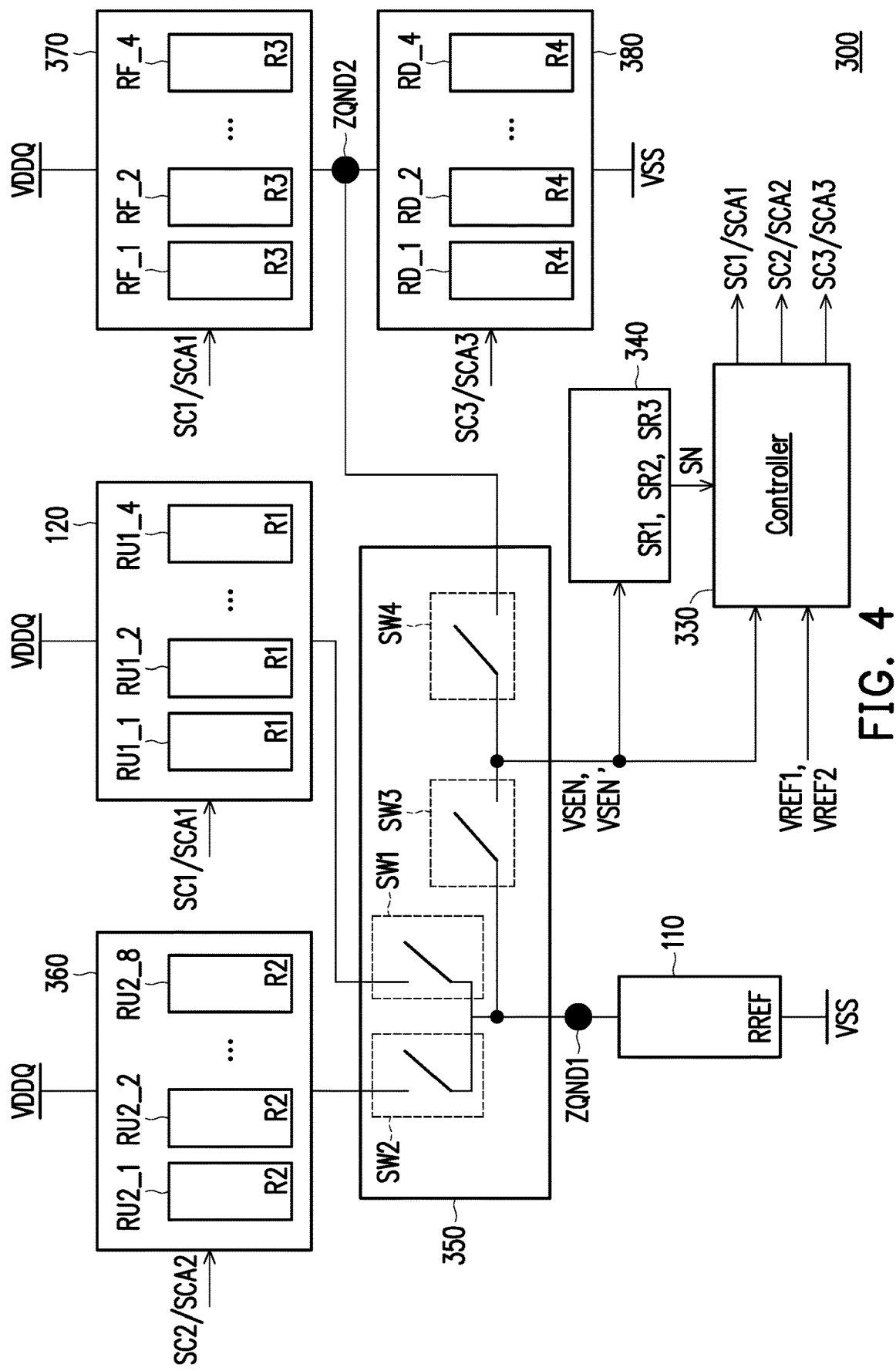
FIG. 4 illustrates a schematic diagram of an impedance adjusting circuit according to an embodiment of the disclosure.

FIG. 4 illustrates a schematic diagram of an impedance adjusting circuit according to an embodiment of the disclosure. Please refer to FIG. 4, in the embodiment, the impedance adjusting circuit 300 includes the reference resistor 110, the first pull-up impedance generator 120, a controller 330, a detection circuit 340, a switching circuit 350, a second pull-up impedance generator 360, a reference pull-up impedance generator 370 and a pull-down impedance generator 380. The configuration of the reference resistor 110 and the first pull-up impedance generator 120 has been clearly explained in the embodiments of FIG. 1 and FIG. 2, so it will not be repeated here.

In the embodiment, the second pull-up impedance generator 360 is coupled to the external voltage VDDQ. The second pull-up impedance generator 360 includes second pull-up impedance units RU2_1 to RU2_8. The second pull-up impedance units RU2_1 to RU2_8 provide a second resistance value R2 respectively in response to a second calibration signal SC2. The second resistance value R2 is different from the first resistance value R1. In the embodiment, the second resistance value R2 is higher than the first resistance value R1. For example, the second resistance value R2 is an integer multiple of the first resistance value R1 and the reference resistance value RREF, but the disclosure is not limited thereto.

In the embodiment, the reference pull-up impedance generator 370 is coupled to the switching circuit 350, the external voltage VDDQ and a second sensing node ZQND2. The reference pull-up impedance generator 370 includes third pull-up impedance units RF_1 to RF_4. The third pull-up impedance units RF_1 to RF_4 for providing a third resistance value R3 respectively in response to the first calibration signal SC1. In the embodiment, the second sensing node ZQND2 may be a connecting pad, but the disclosure is not limited thereto.

In the embodiment, the pull-down impedance generator 380 is coupled to the switching circuit 350, the low reference voltage VSS and the second sensing node ZQND2. The pull-down impedance generator 380 includes pull-down impedance units RD_1 to RD_4. The pull-down impedance units RD_1 to RD_4 provide a fourth resistance value R4 respectively in response to a third calibration signal SC3.

For example, the reference resistance value RREF is 240 Ohm. The first resistance value R1, the third resistance value R3 and the fourth resistance value R4 are about 240 Ohm. The second resistance value R2 is about 480 Ohm. The first pull-up impedance units RU1_1 to RU1_4 are calibrated one by one in the first ZQ calibrating operation. The second pull-up impedance units RU2_1 to RU2_8 are calibrated one by one in a second ZQ calibrating operation. The pull-down impedance units RD_1 to RD_4 are calibrated one by one in a third ZQ calibrating operation. Thus, the first reference voltage VREF1 is set to half of the external voltage VDDQ (that is, VREF1=0.5×VDDQ). The second reference voltage VREF2 is set to one-third of VDDQ (that is, VREF2=0.33× VDDQ).

In the embodiment, the switching circuit 350 connects the first pull-up impedance generator 120, the controller 330 and the detection circuit 340 to the first sensing node ZQND1 in the first ZQ calibrating operation. The switching circuit 350 connects the second pull-up impedance generator 360, the controller 330 and the detection circuit 340 to the first sensing node ZQND1 in the second ZQ calibrating operation. Besides, the switching circuit 350 connects the controller 330 and the detection circuit 340 to the second sensing node ZQND2 in the third ZQ calibrating operation.

The switching circuit 350 includes switches SW1 to SW4. A first terminal of the switch SW1 is connected to the first pull-up impedance generator 120. A second terminal of the switch SW1 is connected to the first sensing node ZQND1. A first terminal of the switch SW2 is connected to the second pull-up impedance generator 360. A second terminal of the switch SW2 is connected to the first sensing node ZQND1. A first terminal of the switch SW3 is connected to the first sensing node ZQND1. A second terminal of the switch SW3 is connected to the controller 330. A first terminal of the switch SW4 is connected to the second sensing node ZQND2. A second terminal of the switch SW4 is connected to the controller 330.

In the embodiment, in the first ZQ calibrating operation, the switches SW1 and SW3 are turned on. The switches SW2 and SW4 are turned off. Therefore, the first pull-up impedance generator 120 and the controller 330 are connected to the first sensing node ZQND1. In the second ZQ calibrating operation, the switches SW2 and SW3 are turned on. The switches SW1 and SW4 are turned off. Therefore, the second pull-up impedance generator 360 and the controller 330 are connected to the first sensing node ZQND1. In the third ZQ calibrating operation, the switch SW4 is turned on. The switches SW3 is turned off. Therefore, the reference pull-up impedance generator 370, the pull-down impedance generator 380 and the controller 330 are connected to the second sensing node ZQND2.

In the embodiment, each of the switches SW1 to SW4 is implemented by at least one transistor or transmission gate. The operations of the switches SW1 to SW4 may be controlled by the controller 330.

In the embodiments, the second pull-up impedance generator 360 includes eight second pull-up impedance units RU2_1 to RU2_8. In some embodiments, the second pull-up impedance generator 360 includes at least one second pull-up impedance unit, the disclosure is not limited by the amount of the second pull-up impedance unit.

In the embodiment, the reference pull-up impedance generator 370 includes four third pull-up impedance units RF_1 to RF_4. The pull-down impedance generator 380 includes four pull-down impedance units RD_1 to RD_4. In some embodiments, the reference pull-up impedance generator 370 includes at least one third pull-up impedance unit. The pull-down impedance generator 380 includes at least one pull-down impedance unit, the disclosure is not limited by the amount of the third pull-up impedance unit and the amount of the pull-down impedance unit.

Figure 5:
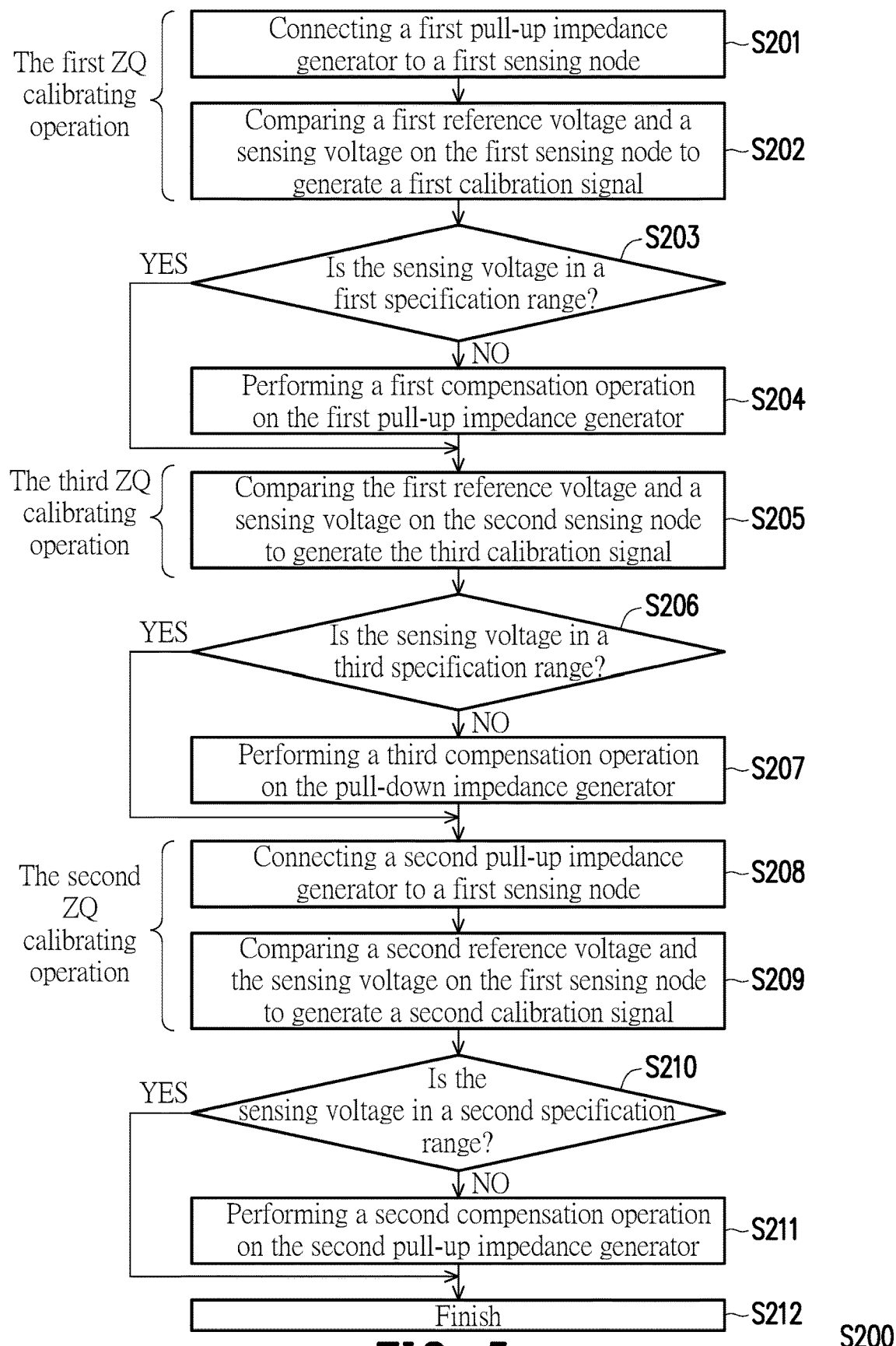
FIG. 5 illustrates a flow chart of an impedance adjusting method according to an embodiment of the disclosure.

FIG. 5 illustrates a flow chart of an impedance adjusting method according to an embodiment of the disclosure. Please refer to FIG. 4 and FIG. 5, in the embodiment, the impedance adjusting method S200 includes steps S201 to S212. In the step S201, the switching circuit 350 connects the first pull-up impedance generator 120 to the first sensing node ZQND1 in the first ZQ calibrating operation. Therefore, the sensing voltage VSEN in generated according to the external voltage VDDQ, the first resistance value R1 and the reference resistance value RREF. In other words, the sensing voltage VSEN is a divided result of the external voltage VDDQ based on the first resistance value R1 and the reference resistance value RREF in the first ZQ calibrating operation.

In the step S202, in the first ZQ calibrating operation, the controller 330 compares the first reference voltage VREF1 and the sensing voltage VSEN to generate the first calibration signal SC1. Therefore, the first pull-up impedance generator 120 adjusts the first resistance value R1 in response to the first calibration signal SC1. The operation of the step S202 has been clearly explained in the embodiments of FIG. 1 and FIG. 2, so it will not be repeated here.

In the step S203, the detection circuit 340 determines the sensing voltage VSEN after the final cycle of the first ZQ calibrating operation. When the sensing voltage VSEN is out of the first specification range SR1. the detection circuit 340 provides the notification signal SN. The controller 330 performs the first compensation operation on the first pull-up impedance generator 120 in response to the notification signal SN in the step S204, so as to modify the first calibration signal SC1 to an adjusted first calibration signal SCA1. Then, the controller 330 performs the third ZQ calibrating operation in the step S205.

On the other hand, when the sensing voltage VSEN is in the first specification range SR1, the controller 330 performs the third ZQ calibrating operation in the step S205.

In the step S205, the second sensing node ZQND2 is connected to the reference pull-up impedance generator 370 and the pull-down impedance generator 380 in the third ZQ calibrating operation. Therefore, the sensing voltage VSEN' on the second sensing node ZQND2 in generated according to the external voltage VDDQ, the third resistance value R3 and the fourth resistance value R4. In other words, the sensing voltage VSEN' is a divided result of the external voltage VDDQ based on the third resistance value R3 and the fourth resistance value R4 in the third ZQ calibrating operation. It should be noted, the third resistance value R3 is provided respectively in response to the first calibration signal SC1. Therefore, after the first ZQ calibrating operation, the third resistance value R3 is similar to the first resistance value R1 after calibrated. Therefore, the third resistance value R3 is acted to be a reference resistance value for the third ZQ calibrating operation.

In the step S206, the detection circuit 340 determines the sensing voltage VSEN' after the final cycle of the third ZQ calibrating operation. When the sensing voltage VSEN' is out of the third specification range SR3. the detection circuit 340 provides the notification signal SN. The controller 330 performs the third compensation operation on the pull-down impedance generator 380 in response to the notification signal SN in the step S207, so as to modify the third calibration signal SC3 to an adjusted third calibration signal SCA3. Then, the controller 330 performs the second ZQ calibrating operation in the steps S208 and S209.

On the other hand, when the sensing voltage VSEN' is in the third specification range SR3, the controller 330 performs the second ZQ calibrating operation in the steps S208 and S209.

In the step S208, the first sensing node ZQND1 is connected to the second pull-up impedance generator 360 in the second ZQ calibrating operation. Therefore, the sensing voltage VSEN on first sensing node ZQND1 in generated according to the external voltage VDDQ, the second resistance value R2 and the reference resistance value RREF. In other words, the sensing voltage VSEN is a divided result of the external voltage VDDQ based on the second resistance value R2 and the reference resistance value RREF in the second ZQ calibrating operation.

In the step S209, in the second ZQ calibrating operation, the controller 330 compares the second reference voltage VREF2 and the sensing voltage VSEN to generate the second calibration signal SC2. Therefore, the second pull-up impedance generator 360 adjusts the second resistance value R2 in response to the second calibration signal SC2.

In the step S210, the detection circuit 340 determines the sensing voltage VSEN after the final cycle of the second ZQ calibrating operation. When the sensing voltage VSEN is out of the second specification range SR2. the detection circuit 340 provides the notification signal SN. The controller 330 performs the second compensation operation on the second pull-up impedance generator 360 in response to the notification signal SN in the step S211, so as to modify the second calibration signal SC2 to an adjusted second calibration signal SCA2. Then, the impedance adjusting method S200 is finished in the step S212.

On the other hand, when the sensing voltage VSEN is in the second specification range SR2, the impedance adjusting method S200 is finished in the step S212.

In the embodiment, the operations of the steps S202, S205 and S209 are similar to the operation of the step S130. In other words, the controller 330 performs the steps S202, S205 and S209 by the bisection method. Thus, based on the bisection method, the controller 330 performs the first ZQ calibrating operation, the second ZQ calibrating operation and the third ZQ calibrating operation rapidly. In the embodiment, the operations of the steps S204, S207 and S211 are similar to the operation of the step S150, so it will not be repeated here.

In the embodiment, the second ZQ calibrating operation is performed after the third ZQ calibrating operation, but the disclosure is not limited thereto. In some embodiments, the third ZQ calibrating operation is performed after the second ZQ calibrating operation.

In some embodiments, the second pull-up impedance generator 360 may be removed. Therefore, the steps S208 to S211 would be omitted. In some embodiments, the reference pull-up impedance generator 370 and the pull-down impedance generator 380 may be removed. Therefore, the steps S205 to S207 would be omitted.

In the embodiment, if the tolerance of the first resistance value R1, the second resistance value R2 and the fourth resistance value R4 are similar from each other, the first specification range SR1, the second specification range SR2 and the third specification range SR3 are similar from each other. If the tolerance of the first resistance value R1, the second resistance value R2 and the fourth resistance value R4 are different from each other, the first specification range SR1, the second specification range SR2 and the third specification range SR3 are different from each other.

In view of the foregoing, when the sensing voltage is out of a first specification range in the first ZQ calibrating operation, the first compensation operation is performed on the first pull-up impedance generator, the first calibration signal is modified to the adjusted first calibration signal. Therefore, the ZQ calibration result of the ZQ calibration meets an expected specification. The first calibration signal is generated by the bisection method. Therefore, the first calibration signal is generated rapidly. Besides, the sensing voltage is detected after the final cycle of the first ZQ calibrating operation. Therefore, the first compensation operation does not significantly increase the burden on the impedance adjusting circuit and the impedance adjusting method.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An impedance adjusting circuit for zero quotient (ZQ) calibration, comprising:
   a reference resistor, coupled between a first sensing node and a low reference voltage;
   a first pull-up impedance generator, coupled to an external voltage, wherein the first pull-up impedance generator comprises a plurality of first pull-up impedance units for providing a first resistance value respectively in response to a first calibration signal;
   a controller, coupled to the first sensing node, configured to connect the first pull-up impedance generator to the first sensing node, and compare a first reference voltage and a sensing voltage on the first sensing node to generate the first calibration signal in a first ZQ calibrating operation; and
   a detection circuit, coupled to the first sensing node and the controller, configured to detect the sensing voltage,
   wherein when the sensing voltage is out of a first specification range in the first ZQ calibrating operation, the detection circuit notifies the controller to perform a first compensation operation on the first pull-up impedance generator, and modifies the first calibration signal to an adjusted first calibration signal,
   wherein an adjusting resolution of the first compensation operation is higher than an adjusting resolution of the first ZQ calibrating operation.

2. The impedance adjusting circuit of claim 1, wherein when the sensing voltage is in the first specification range in the first ZQ calibrating operation, the detection circuit notifies the controller to stop performing the first compensation operation.

3. The impedance adjusting circuit of claim 1, wherein the controller generates the first calibration signal by a bisection method.

4. The impedance adjusting circuit of claim 3, wherein the detection circuit detects the sensing voltage after a final cycle of the first ZQ calibrating operation.

5. The impedance adjusting circuit of claim 3, wherein:
   the first calibration signal is a trim digital code having a plurality of bits, and
   the detection circuit detects the sensing voltage after a least significant bit of the first calibration signal is determined.

6. The impedance adjusting circuit of claim 3, wherein:
   the controller generates the first calibration signal in a (n)th cycles of the bisection method,
   in the first compensation operation, when the sensing voltage corresponding a calibration signal in a (n−1)th cycle of the first ZQ calibrating operation is in the first specification range, the controller sets the calibration signal in the (n−1)th cycle of the first ZQ calibrating operation as the adjusted first calibration signal, and
   wherein "n" is positive integer greater than "1".

7. The impedance adjusting circuit of claim 1, wherein in the first compensation operation, the controller trims the first calibration signal with the adjusting resolution of the first compensation operation.

8. The impedance adjusting circuit of claim 1, further comprising:
   a second pull-up impedance generator, coupled to the external voltage, wherein the second pull-up impedance generator comprises a plurality of second pull-up impedance units for providing a second resistance value respectively in response to a second calibration signal, wherein the second resistance value is different from the first resistance value;
   a switching circuit, coupled to the first sensing node, the first pull-up impedance generator, the second pull-up impedance generator and controller, configured to connect the first pull-up impedance generator to the first sensing node in the first ZQ calibrating operation and connect the second pull-up impedance generator to the first sensing node in a second ZQ calibrating operation based on a controlling of the controller.

9. The impedance adjusting circuit of claim 1, wherein:
   the controller compares a second reference voltage and the sensing voltage on the first sensing node to generate the second calibration signal in the second ZQ calibrating operation, and
   when the sensing voltage is out of a second specification range in the second ZQ calibrating operation, the detection circuit notifies the controller to perform a second compensation operation on the second pull-up impedance generator, and modifies the second calibration signal to an adjusted second calibration signal.

10. The impedance adjusting circuit of claim 1, wherein:
    the first calibration signal is set as a built-in calibration signal, and
    the controller outputs the built-in calibration signal to the first pull-up impedance generator in response to an external command.

11. An impedance adjusting method for zero quotient (ZQ) calibration, comprising:
    providing a reference resistor and a first pull-up impedance generator, wherein the reference resistor is coupled between a first sensing node and a low reference voltage, wherein the first pull-up impedance generator includes a plurality of first pull-up impedance units for providing a first resistance value respectively in response to a first calibration signal;

connecting the first pull-up impedance generator to the first sensing node;

comparing a first reference voltage and a sensing voltage on the first sensing node to generate the first calibration signal in a first ZQ calibrating operation;

detecting the sensing voltage; and when the sensing voltage is out of a first specification range in the first ZQ calibrating operation, performing a first compensation operation on the first pull-up impedance generator, so as to modify the first calibration signal to an adjusted first calibration signal, wherein an adjusting resolution of the first compensation operation is higher than an adjusting resolution of the first ZQ calibrating operation.

12. The impedance adjusting method of claim 11, further comprising:

when the sensing voltage is in the first specification range in the first ZQ calibrating operation, setting the first calibration signal as the adjusted first calibration signal.

13. The impedance adjusting method of claim 11, wherein the step of comparing a first reference voltage and a sensing voltage on the first sensing node to generate the first calibration signal in a first ZQ calibrating operation comprises:

generating the first calibration signal by a bisection method.

14. The impedance adjusting method of claim 13, wherein the step of detecting the sensing voltage comprises:

detecting the sensing voltage after a final cycle of the first ZQ calibrating operation.

15. The impedance adjusting method of claim 13, wherein the first calibration signal is a trim digital code having a plurality of bits, wherein the step of detecting the sensing voltage comprises:

detecting detect the sensing voltage after a least significant bit of the first calibration signal is determined.

16. The impedance adjusting method of claim 13, wherein the first calibration signal is generated in a (n)th cycles of the bisection method, wherein the step of performing a first compensation operation on the first pull-up impedance generator comprises:

in the first compensation operation, when the sensing voltage corresponding a calibration signal in a (n−1)th cycle of the first ZQ calibrating operation is in the first specification range, setting the calibration signal in the (n−1)th cycle of the first ZQ calibrating operation as the adjusted first calibration signal, wherein "n" is positive integer greater than "1".

17. The impedance adjusting method of claim 11, wherein the step of performing a first compensation operation on the first pull-up impedance generator comprises:

trimming the first calibration signal with the adjusting resolution of the first compensation operation.

18. The impedance adjusting method of claim 11, further comprising:

providing a second pull-up impedance generator, wherein the second pull-up impedance generator is coupled to the external voltage, wherein the second pull-up impedance generator comprises a plurality of second pull-up impedance units for providing a second resistance value respectively in response to a second calibration signal, wherein the second resistance value is different from the first resistance value;

connecting the second pull-up impedance generator to the first sensing node in a second ZQ calibrating operation;

comparing a second reference voltage and the sensing voltage on the first sensing node to generate the second calibration signal in the second ZQ calibrating operation; and when the sensing voltage is out of a second specification range in the second ZQ calibrating operation, performing a second compensation operation on the second pull-up impedance generator, and modifying the second calibration signal to an adjusted second calibration signal.

* * * * *